(12) United States Patent
Messier et al.

(10) Patent No.: US 10,615,230 B2
(45) Date of Patent: Apr. 7, 2020

(54) IDENTIFYING POTENTIALLY-DEFECTIVE PICTURE ELEMENTS IN AN ACTIVE-MATRIX DISPLAY PANEL

(71) Applicant: Teradyne, Inc., North Reading, MA (US)

(72) Inventors: Jason A. Messier, Winchester, MA (US); Bradley A. Phillips, Westlake Village, CA (US); Kyle L. Klatka, Arlington, MA (US); Brian L. Massey, Beaverton, OR (US); Peter J. D'Antonio, Winchester, MA (US); Anthony J. Suto, Sterling, MA (US)

(73) Assignee: Teradyne, Inc., North Reading, MA (US)

( * ) Notice: Subject to any disclaimer, the term of this patent is extended or adjusted under 35 U.S.C. 154(b) by 159 days.

(21) Appl. No.: 15/936,762

(22) Filed: Mar. 27, 2018

(65) Prior Publication Data

US 2019/0140032 A1    May 9, 2019

Related U.S. Application Data

(63) Continuation-in-part of application No. 15/807,243, filed on Nov. 8, 2017, now abandoned.

(51) Int. Cl.
   *H01L 27/32* (2006.01)
   *G09G 3/3225* (2016.01)
   *G09G 3/00* (2006.01)

(52) U.S. Cl.
   CPC ......... *H01L 27/3244* (2013.01); *G09G 3/006* (2013.01); *G09G 3/3225* (2013.01); *G09G 2330/10* (2013.01)

(58) Field of Classification Search
   CPC .. H01L 27/3244; G09G 3/3225; G09G 3/006; G09G 2330/10
   See application file for complete search history.

(56) References Cited

U.S. PATENT DOCUMENTS

| | | |
|---|---|---|
| 4,852,821 A | 8/1989 | Harris et al. |
| 5,526,930 A | 6/1996 | Spina et al. |
| 5,695,186 A | 12/1997 | Phillips et al. |
| 6,695,029 B2 | 2/2004 | Phillips et al. |
| 6,695,030 B1 | 2/2004 | Phillips |
| 6,929,048 B2 | 8/2005 | Phillips |

(Continued)

FOREIGN PATENT DOCUMENTS

| CN | 102804248 B | 1/2016 |
|---|---|---|
| CN | 102656621 B | 2/2016 |

(Continued)

OTHER PUBLICATIONS

File History for U.S. Appl. No. 15/801,243, 90 pages (dated Mar. 19, 2019).

*Primary Examiner* — Abbas I Abdulselam
(74) *Attorney, Agent, or Firm* — Burns & Levinson LLP (57) ABSTRACT

An example process includes: powering, via a power supply, an active-matrix display panel comprised of picture elements; and identifying, based on an output of the power supply, one or more picture elements in the active-matrix display panel that are potentially defective. The example process may also include identifying, among one or more of the picture elements that are potentially-defective, one or more picture elements that actually are defective.

58 Claims, 4 Drawing Sheets

(56) References Cited

U.S. PATENT DOCUMENTS

| | | |
|---|---|---|
| 7,032,285 B2 | 4/2006 | Phillips |
| 7,238,252 B2 | 7/2007 | Phillips |
| 7,238,424 B2 | 7/2007 | Raksha et al. |
| 7,291,365 B2 | 11/2007 | Kay et al. |
| 7,327,816 B2 | 2/2008 | Messier |
| 7,336,748 B2 | 2/2008 | Messier |
| 7,496,487 B2 | 2/2009 | Wakelam et al. |
| 7,523,238 B2 | 4/2009 | Messier |
| 7,555,557 B2 | 6/2009 | Bradley et al. |
| 7,651,206 B2 | 1/2010 | Hawkins et al. |
| 7,682,002 B2 | 3/2010 | Brost et al. |
| 7,701,421 B2 | 4/2010 | Ogura |
| 8,111,222 B2 | 2/2012 | Johnson et al. |
| 8,144,040 B2 | 3/2012 | Messier et al. |
| 8,193,956 B2 | 6/2012 | Messier et al. |
| 8,305,737 B2 | 11/2012 | Ewing et al. |
| 8,310,256 B2 | 11/2012 | Suto |
| 8,604,820 B2 | 12/2013 | Suto |
| 8,618,810 B2 | 12/2013 | Suto et al. |
| 8,692,538 B2 | 4/2014 | Phillips |
| 8,760,183 B2 | 6/2014 | Suto |
| 8,760,185 B2 | 6/2014 | Suto |
| 8,988,329 B2 | 3/2015 | Yoon et al. |
| 9,459,312 B2 | 10/2016 | Arena et al. |
| 9,503,065 B1 | 11/2016 | Antonie van der Wagt et al. |
| 9,638,742 B2 | 5/2017 | Suto et al. |
| 9,778,314 B2 | 10/2017 | Suto |
| 9,977,052 B2 | 5/2018 | Suto et al. |
| 2003/0230750 A1 | 12/2003 | Koyama et al. |
| 2003/0231834 A1 | 12/2003 | Massey et al. |
| 2004/0179145 A1* | 9/2004 | Jacobsen ........... G02F 1/133305 349/45 |
| 2004/0206307 A1 | 10/2004 | Boroson et al. |
| 2004/0229387 A1* | 11/2004 | Jinno ................. H01L 27/3244 438/12 |
| 2005/0038636 A1 | 2/2005 | Wakelam et al. |
| 2005/0051277 A1 | 3/2005 | Phillips |
| 2005/0120127 A1 | 6/2005 | Bradley et al. |
| 2005/0132929 A1 | 6/2005 | Raksha et al. |
| 2005/0135524 A1 | 6/2005 | Messier |
| 2005/0135525 A1 | 6/2005 | Messier |
| 2005/0193543 A1 | 9/2005 | Phillips |
| 2005/0194089 A1 | 9/2005 | Phillips |
| 2005/0196525 A1 | 9/2005 | Phillips |
| 2005/0266172 A1 | 12/2005 | Kay et al. |
| 2006/0001023 A1 | 1/2006 | Akiyama et al. |
| 2006/0231794 A1* | 10/2006 | Sakaguchi ............ G09G 3/002 252/299.61 |
| 2006/0267625 A1 | 11/2006 | Kaneko |
| 2007/0005282 A1 | 1/2007 | Messier |
| 2009/0168575 A1 | 7/2009 | Messier |
| 2010/0207651 A1 | 8/2010 | Suto |
| 2010/0328849 A1 | 12/2010 | Ewing et al. |
| 2011/0001644 A1 | 1/2011 | Messier et al. |
| 2011/0001645 A1 | 1/2011 | Messier et al. |
| 2011/0148446 A1 | 6/2011 | Suto |
| 2011/0148450 A1 | 6/2011 | Suto |
| 2011/0204910 A1 | 8/2011 | Suto |
| 2011/0210759 A1 | 9/2011 | Suto |
| 2011/0279437 A1 | 11/2011 | Komiya et al. |
| 2012/0033144 A1 | 2/2012 | Kim et al. |
| 2012/0225366 A1 | 9/2012 | Suto et al. |
| 2012/0299978 A1 | 11/2012 | Chaji |
| 2012/0313618 A1 | 12/2012 | Phillips |
| 2014/0306728 A1 | 10/2014 | Arena et al. |
| 2016/0054385 A1 | 2/2016 | Suto |
| 2017/0032722 A1* | 2/2017 | Wang .................... G09G 3/006 |
| 2017/0098398 A1* | 4/2017 | Amatsuchi ............ G09G 3/006 |
| 2017/0292873 A1 | 10/2017 | Schleicher et al. |
| 2018/0032300 A1* | 2/2018 | Singh .................... B60K 35/00 |
| 2018/0095109 A1 | 4/2018 | Suto et al. |
| 2018/0164852 A1* | 6/2018 | Lim ..................... H04M 1/0214 |
| 2018/0350299 A1* | 12/2018 | Chaji .................. G09G 3/3225 |
| 2019/0140032 A1 | 5/2019 | Messier et al. |

FOREIGN PATENT DOCUMENTS

| | | |
|---|---|---|
| CN | 105303999 A | 2/2016 |
| CN | 103562988 B | 4/2017 |
| KR | 20070090917 A | 9/2007 |
| WO | WO-2004070685 A1 | 8/2004 |
| WO | WO-2006/062965 A2 | 6/2006 |
| WO | WO-2011/058428 A1 | 5/2011 |
| WO | WO-2011/114299 A1 | 9/2011 |
| WO | WO-2012/160471 A1 | 11/2012 |

* cited by examiner

FIG. 4

IDENTIFYING POTENTIALLY-DEFECTIVE PICTURE ELEMENTS IN AN ACTIVE-MATRIX DISPLAY PANEL

CROSS-REFERENCE TO RELATED APPLICATION

This application is a continuation-in-part of U.S. patent application Ser. No. 15/807,243, which was filed Nov. 8, 2017. The contents of U.S. patent application Ser. No. 15/807,243 are incorporated herein by reference.

TECHNICAL FIELD

This specification relates generally to processes for identifying potentially-defective picture elements in an active-matrix display panel.

BACKGROUND

A flat panel display includes picture elements, such as pixels or subpixels, that each can be addressed individually to produce an output, such as a color, a luminosity, or both. In an active-matrix-type display panel, each picture element is attached to a transistor and to a capacitor. As a result, each picture element may maintain its prior state, while other picture elements are being addressed.

In an example active-matrix display panel, the matrix of picture elements can be modeled as a matrix of digitally-controlled current sources, where digital control for each of the picture elements is included in video stream data. For example, the video stream data may indicate which of the picture elements should be illuminated in order to produce an output image. The display may be refreshed periodically in order to change the image on the display. During refresh, different picture elements may be turned-on or turned-off. When the refresh rate is high enough, the human eye perceives on-screen motion based on the images changing on the display.

SUMMARY

An example method comprises powering, via a power supply, an active-matrix display panel comprised of picture elements; and identifying, based on an output of the power supply, one or more picture elements in the active-matrix display panel that are potentially defective. The example method may include one or more of the following features, either alone or in combination.

Identifying the one or more picture elements that are potentially defective may comprise: removing a quasi-static component of the output of the power supply leaving a remainder output; and determining that the one or more picture elements are potentially defective based on the remainder output. The remainder output may have a frequency that is higher than a frequency of the quasi-static component. The output of the power supply may have a dynamic range that exceeds a predetermined range. The quasi-static component may be removed so that the remainder output has a dynamic range that is less than the predetermined range.

The example method may comprise identifying, among one or more of the picture elements that are potentially-defective, one or more picture elements that are defective by comparing at least the remainder output to a predefined baseline for the active-matrix display panel. The example method may comprise identifying, among one or more of the picture elements that are potentially-defective, one or more picture elements that are defective by performing operations comprising: processing outputs of a number of picture elements on the display panel to produce a baseline; and comparing at least the remainder output to the produced baseline. The processing may comprise generating an average of the outputs of all picture elements on the display panel to produce the baseline.

Identifying the one or more picture elements that are potentially defective may comprise: controlling a data stream to the active-matrix display panel so that a sum of digital codes in the data stream remains substantially constant for multiple refreshes of the active-matrix display panel; detecting the output of the power supply to a first set of the picture elements during a first refresh of the multiple refreshes to produce a first output; detecting the output of the power supply to a second set of the picture elements during a second refresh of the multiple refreshes to produce a second output; and detecting a mismatch between at least two picture elements based on a difference between the first output and the second output. The at least two picture elements may comprise a first picture element in the first set but not in the second set, and a second picture element in the second set but not in the first set.

The power supply may comprise a hybrid power supply and the output of the power supply may comprise a first output range and a second output range. The hybrid power supply may comprise a high-frequency part and a low-frequency part. The low-frequency part may be for producing the first output range covering a first frequency spectrum, and the high-frequency part may be for producing the second output range covering a second frequency spectrum. The first frequency spectrum may comprise frequencies that are lower than frequencies in the second frequency spectrum. The high-frequency part and the low-frequency part may comprise separate power supplies. The high-frequency part and the low-frequency part may be, or comprise, parts of a single power supply. The high-frequency part may be configured to strip signals in the first frequency spectrum to produce signals in the second frequency spectrum. Identifying the one or more picture elements that are potentially defective may comprise detecting a mismatch between at least two picture elements when the second output range of the power supply contains a nonzero value.

The power supply may comprise a hybrid power supply and the output of the power supply may comprise a first output range and a second output range. The hybrid power supply may comprise a high-frequency part and a low-frequency part. The low-frequency part may be for producing the first output range covering a first frequency spectrum, and the high-frequency part may before producing the second output range covering a second frequency spectrum. The first frequency spectrum may comprise frequencies that are lower than frequencies in the second frequency spectrum. Identifying the one or more picture elements that are potentially defective may comprise detecting a mismatch among the picture elements. Detecting the mismatch may comprise: controlling a data stream to the active-matrix display panel so that a sum of digital codes in the data stream remains substantially constant for multiple refreshes of the active-matrix display panel; detecting a first output of the power supply to a first set of the picture elements during a first refresh of the multiple refreshes; and detecting a second output of the power supply to a second set of the picture elements during a second refresh of the multiple refreshes to produce a second output. The mismatch may comprise a difference between the first output and the second output. The difference may be in the second output range.

The example method may comprise calibrating the picture elements based at least on the output of the power supply to correct, at least partly, mismatches among at least some of the picture elements. The mismatches may result from at least one of transistor threshold voltage variations or transistor mobility variations introduced by picture element hardware. Calibrating the picture elements may comprise correcting for at least one of the transistor threshold voltage variations, transistor mobility variations, or a combination of the transistor threshold voltage variations and the transistor mobility variations. Calibrating the picture elements may comprise: generating calibration values for at least some of the picture elements based on the output of the power supply, with the output comprising multiple values; and storing the calibration values in computer memory for use by the active-matrix display panel. The active-matrix display panel may comprise an input interface configured to connect to a device comprising the computer memory in order to receive the calibration values. The input interface may be, or comprise, an industry standard, non-customized interface. The input interface may be, or comprise, a customizable interface. The picture element hardware may comprise a transconductance amplifier configured to receive voltage and to output current to an organic light emitting diode (OLED).

The active-matrix display panel may comprise an active-matrix organic light-emitting diode (AMOLED) display panel. The picture elements may comprise subpixels of the AMOLED display panel.

The active-matrix display panel may be, or include, a curved active-matrix display panel. The active-matrix display panel may be, or include, a foldable active-matrix display panel. The active-matrix display panel may be part of a mobile computing device. The active-matrix display panel may be part of a an automobile. The operations may be performed periodically as part of a process to calibrate the active-matrix display panel. The system may be implemented as a tool for calibrating the active-matrix display panel.

An example tool that is portable includes memory storing instructions that are executable; and one or more processing devices to execute the instructions to perform operations that include: identifying, based on an output of a power supply, one or more picture elements in an active-matrix display panel that are potentially defective; and calibrating the active-matrix display panel by adjusting the one or more picture elements based on coefficients. The example tool may include one or more of the following features, either alone or in combination.

The tool may be self-contained. The tool may include one or more interfaces to connect to a mobile computing device comprising the active-matrix display panel. The tool may include one or more interfaces to connect to an automobile comprising the active-matrix display panel.

Any two or more of the features described in this specification, including in this summary section, can be combined to form implementations not specifically described herein.

The systems and techniques and processes described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques and processes described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Described herein are example implementations of a process for identifying potentially-defective picture elements in an active-matrix display panel. Examples of active-matrix display panels include, but are not limited to, an active-matrix organic light-emitting diode (AMOLED) panel and an active-matrix liquid crystal display (LCD) panel. A picture element may be, or include, the smallest unit of controllable content on a display. For example, a picture element may be, or include, a pixel of a display panel or a subpixel that, together with other subpixels, form a pixel of the display panel. After potentially-defective picture elements are identified, any appropriate processing may be performed. For example, the potentially-defective picture elements may be processed to identify which of them are actually defective, e.g., by comparing characteristics of the potentially-defective picture elements to one or more predefined baselines. A baseline may indicate acceptable tolerances or deviations for individual picture elements, beyond which a picture element is deemed defective. An active-matrix display panel found to contain defective picture elements may be calibrated to correct for, or to reduce the visual effects of, the defective picture elements. The process may be implemented, at least in part, using a test system, such as automatic test equipment (ATE); however, the process is not limited to this context.

In an example implementation, the process includes powering, via a hybrid power supply, an active-matrix display panel comprised of picture elements; and identifying, based on an output of the power supply, one or more picture elements in the active-matrix display panel that are potentially defective. In an example, identifying the one or more picture elements that are potentially defective includes removing a quasi-static component of the output of the power supply leaving a remainder output; and determining that the one or more picture elements are potentially defective based on the remainder output. For example, if the remainder output for a picture element is non-zero, that picture element is a candidate for being defective. If the remainder output for a picture element deviates from a baseline—which may be predefined or determined dynamically for a panel—that picture element may be deemed actually defective. Examples of how the quasi-static component is removed are described in detail below. In some implementations, the quasi-static component of the power supply output includes a voltage that maintains its value, but that may include predetermined, typically insignificant, variations over time. For example, the quasi-static component of the output may be the part of the output that is substantially DC (direct current). The remainder output is in a higher frequency range than the quasi-static component and may include current from the power supply that is AC (alternating current).

By removing the quasi-static component of the output, the example process may make it possible to identify potentially-defective picture elements using test circuitry, such as test equipment, that is less complex. More specifically, in some examples, the output of the power supply has a dynamic range that may be in excess of 150 decibels (dB), e.g., 166 dB in an example. The bit precision currently available on test circuitry may make it unable to process signals across a dynamic range of this magnitude. For example, the higher-frequency signals, upon which potentially-defective picture elements may be identified, may be lost. By removing the quasi-static component of the output, the dynamic range that is to be considered may be decreased, allowing the signals to be modeled using fewer bits and, thus, processed using less complex test circuitry. In some implementations, the processing may be performed using standard test equipment.

In some implementations, the quasi-static component of the power supply output may be removed by controlling a data stream, such as a video stream, to the active-matrix display panel. For example, the data stream to the active-matrix display panel may be controlled so that a sum of digital codes in the data stream remains substantially constant for multiple refreshes of the active-matrix display panel. That way, the current to the active-matrix display panel, or a portion thereof, remains substantially constant. In this example, "substantially constant" includes a constant value having variations that are deemed to be acceptable. Acceptable variations may include, but are not limited to, 1%, 2%, 3%, 4%, 5%, and so forth of the total current.

An example implementation includes detecting a first output of the power supply to a first set of picture elements on the active-matrix display panel during a first refresh; and detecting a second output of the power supply to a second set of the picture elements during a second refresh. The first and second sets of picture elements include at least one picture element not in common. The process further includes detecting a mismatch between at least two picture elements, including the at least one picture element not in common, based on a difference between the first output and the second output. In some implementations, a mismatch includes a non-zero AC component that is part of the difference, as described herein.

In some implementations, by controlling the data stream so that a sum of digital codes in the data stream remains substantially constant, the amount of current to the picture elements may be kept substantially constant for properly-functioning picture elements. Thus, where the difference between the first and second outputs of the power supply is zero, or within an acceptable tolerance of zero, there are no defective picture elements. That is, the DC portions of the current cancel each other out, and the AC portion is zero, indicating that there are no defective picture elements. However, where the difference between the first and second outputs of the power supply is non-zero, and outside of an acceptable tolerance, defective picture elements may be present. That is, the DC portions of the current cancel each other out, leaving an AC current, which may be used to identify potentially-defective picture elements among the picture elements under consideration. Potentially-defective picture elements may be identified by comparing groups of picture elements under consideration, as described herein.

In some implementations, the power supply is a hybrid power supply, which may be implemented using a single device or multiple devices. An example hybrid power supply produces output in a first output range and in a second output range. The example hybrid power supply includes a high-frequency part and a low-frequency part, with the low-frequency part for producing the first output range covering a first, low-frequency spectrum, and with the high-frequency part for producing the second output range covering a second, high-frequency spectrum. The first, low-frequency spectrum includes frequencies that are lower than frequencies in the second, high-frequency spectrum. In an example, the high-frequency part and the low-frequency part are implemented using separate physical devices. In an example, the high-frequency part and the low-frequency part are constituents of a single power supply, with the high-frequency part stripping (e.g., removing) signals in the low-frequency spectrum to produce, and to output, the signals in the high-frequency spectrum.

In an example implementation, the hybrid power supply comprises a dual-loop power supply, where the dual loops include a DC loop and an AC loop. In this example, the DC loop performs DC regulation of an active-matrix display panel, and is high-impedance (Z) in the frequency band from ~50 kHz (kilohertz) to ~1 MHz (megahertz). In this example, the AC loop is high-impedance (Z) at frequencies less than 50 kHz—in some cases, at frequencies much less than 50 kHz, and can make high gain measurements of current transients in the range from ~50 kHz to ~1 MHz. The AC loop can be regulating or non-regulating in some implementations. Although this example is presented, the hybrid power supply is not limited to this configuration or operation, including operation within the frequency ranges specified.

In an example implementation, an AMOLED panel matrix of subpixels can be modeled as an N×M×3 (N, M≥1) matrix of digitally-controlled current sources, where digital control for the subpixels is implemented in video stream data. In an example implementation, an AMOLED panel matrix of subpixels can be modeled as an N×M×2 (N, M≥1) matrix of digitally-controlled current sources, where digital control for the subpixels is implemented in video stream data. In an example implementation, an AMOLED panel matrix of subpixels can be modeled as an N×M×4 (N, M≥1) matrix of digitally-controlled current sources, where digital control for the subpixels is implemented in video stream data. Any appropriate AMOLED panel may be used.

In an AMOLED display panel, each pixel is comprised of three individually-controllable subpixels (the picture elements, in this example), representing red, green, and blue. The example process keeps the long- and medium-term total average of current flowing through the subpixels to be substantially constant, while modulating which of the subpixels is sourcing current. Once the system stabilizes, a significant portion of the fast transient current is due to source driver updates to subpixel driving circuits. Thus, any mismatch between subpixel driving circuits is shifted to a higher frequency band (~50 kHz to ~1 MHz) and measured by the power supply's AC loop, while the remaining (e.g., quasi-static) current required to supply the OLED devices shifts to DC and is serviced by the power supply's DC loop. By measuring the fast transient current having a high dynamic range, and making real-time processing updates to the subpixel driving circuits' current, mismatches between the driving circuits (e.g., transistor threshold voltage and transistor mobility) can be identified.

Absent the process described herein, for a mobile-sized AMOLED panel, the current sense dynamic range may need to be ~27 ENOB (effective number of bits) at a 1 MHz bandwidth, which not implementable using existing analog-to-digital converters (ADCs). Using the process described herein, it may be possible to measure current mismatches of hundreds of picoamperes in display panels that that operate at currents of hundreds of milliamperes total using a relatively modest ADC—e.g., potentially as little as 10 to 15 ENOB—depending on the effective gain implementable in the AC loop. Although this example is presented in the context of an AMOLED display panel, the example processes may be used with any appropriate active-matrix display panel.

Figure 1:
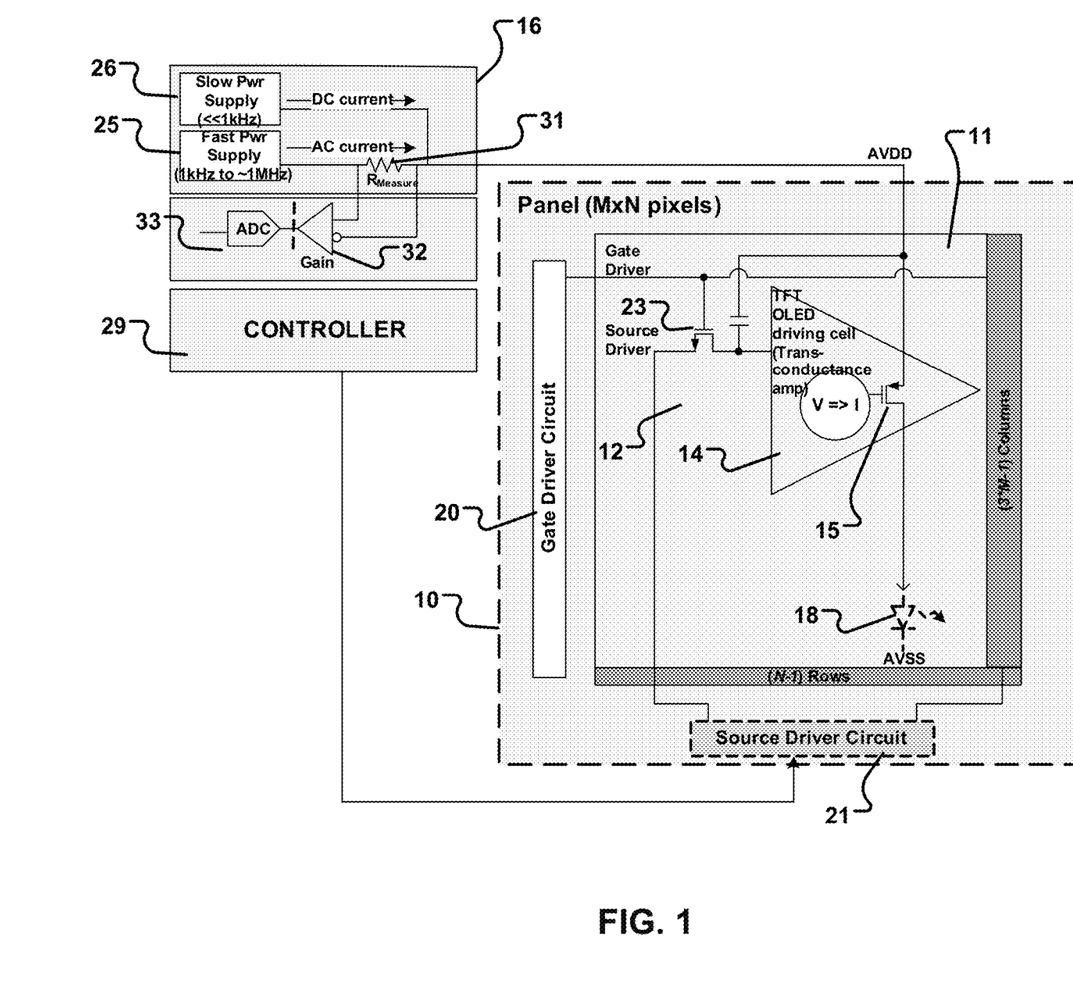
FIG. 1 is a diagram of an example picture element on an active-matrix display panel and associated circuitry.

FIG. 1 shows an example implementation of components of an AMOLED display panel 10, including a subpixel 11 thereof. In this example, panel 10 includes an array of M×N pixels, each of which is comprised of a number of subpixels—the picture elements in this example—that are individually controllable to produce an output. In this example, each pixel is comprised of three subpixels; however, the process is not limited to this number. A subpixel 11 is shown in FIG. 1. Subpixel 11 may be implemented using a thin-film transistor (TFT) OLED driving cell, or circuit 12; however, the process is not limited to use circuitry of this configuration. In this example, TFT OLED driving circuit 12 includes a transconductance amplifier 14 having a transistor 15. Voltage is provided to the source of transistor 15 via a hybrid power supply 16 of the type described herein. The voltage, $AV_{DD}$ is applied as shown in FIG. 1. When TFT OLED driving circuit 12 is activated, as described below, current from the transconductance amplifier 14 is applied, through transistor 15, to the anode of OLED 18 which, in response, produces appropriate content, such as red, green, or blue light. The cathode of OLED 18 is connected to a reference voltage $AV_{SS}$, as shown.

In this example, the subpixels on panel 10, including subpixel 11, are arranged in, and addressable by, rows and columns. A gate driver circuit 20 is configured to address rows of the panel. For example, when activated, the gate driver circuit effectively enables an entire row of subpixels. In this example, when a row is enabled, the individual subpixels contained in that row are available for illumination. Enabling a row does not mean that all of its subpixels are illuminated. A source driver circuit 21 is configured to address columns of subpixels. Accordingly, when a row of subpixels is enabled, source drive circuit 21 is controllable to select individual subpixels in that enabled row for illumination. Refresh of the panel is performed on a row-by-row basis under the control of gate driver circuit 20. For example, gate driver circuit may enable each row of subpixels, consecutively and in-turn. As each row is enabled, source driver circuit enables, e.g., illuminates, selected individual subpixels, as described.

In the example of FIG. 1, source driver circuit 21 applies a voltage to the source of transistor 23. When gate driver 21 applies a voltage to the gate of transistor 23, the voltage from source driver circuit 21 passes to the TFT OLED driver circuit 12, thereby activating the subpixel and enabling current to pass to OLED 18. As noted, the process is not limited to use with subpixels of the type shown in FIG. 1; that is an example only.

As explained, in this example, example hybrid power supply 16 includes a high-frequency (fast) part 25 to implement an AC loop and a low-frequency (slow) part 26 to implement a DC loop. Hybrid power supply 16 supply may be implemented using any appropriate technology, and may be implemented in single device or in multiple devices. For example, in the context of a single device, the high-frequency part may be configured to strip signals in a low frequency spectrum to produce signals in the high frequency spectrum. Examples of frequency spectra for the high-frequency part are presented herein; however, the process is not limited to use with these frequencies. In the example of FIG. 1, high-frequency part 25 produces current at frequencies of 1 kHz to ~1 MHz. Examples of frequency spectra for the low-frequency part are presented herein; however, the process is not limited to use with these frequencies. In the example of FIG. 1, low-frequency part 26 produces current at frequencies of <<1 kHz. The high-frequency and low-frequency components together enable $AV_{DD}$, as shown.

The example of FIG. 1 also includes controller 29 or other appropriate circuitry for producing, and for outputting, the video stream, to the source driver circuit. In this regard, in some implementations, the refresh rate is predefined on the active-matrix panel. That is, refresh, and thus control by the gate driver, occurs automatically at a predefined rate. The video stream is applied to, and controls, the source driver circuit to illuminate subpixels, and thus produce images, on the active-matrix display panel. In some implementations, controller 29 may include a field-programmable gate array (FPGA), one or more processing devices of the type described herein, or a combination of logic—programmable or not—and one or more processing devices. In some implementations, the video stream is applied to the source driver via an industry standard, non-customized interface, such as a MIPI (mobile industry processor interface) interface. In some implementations, the video stream is applied to the source driver via a non-industry-standard interface, a customizable interface, or an interface that is both non-industry-standard and customizable.

In the example of FIG. 1, the circuitry also includes an ammeter 31, an amplifier 32, and an ADC 33. In this example, ammeter 31 is a resistor to measure the current output of high-frequency part 25. In some implementations, other types of current measurement circuitry may be used. Amplifier 32 magnifies the resulting analog signal indicative of the current, and ADC 33 digitizes the resulting amplified analog signal for output to a computing device—e.g., one or more processing devices—for processing, analysis, or other operations. In some implementations, a circuit containing similar components may be configured and arranged to measure the DC current output of hybrid power supply for each subpixel or other type of picture element, and to provide that information for processing, analysis, or other operations.

As described herein, the example process—including variations thereof—identifies potentially-defective picture elements in an active-matrix display panel by subtracting-out the low-frequency/quasi-static/DC component of the current for two or more sets of picture elements, leaving a high-frequency/AC component. The high-frequency/AC component may be used to identify potentially-defective picture elements in the active-matrix display panel. That is, the high-frequency component has a dynamic range that may be represented using a number of bits—for example, 10 to 15 ENOB—that can be processed using less complex circuitry of the type available circa 2017AD. The high-frequency component may be compared to a baseline, such as one of more baseline curves in order to determine if a potentially-defective picture element is actually defective. A defective picture element may deviate, or vary, from a performance defined by the baseline. The baseline may be predefined or determined dynamically for a panel. For example, the baseline may be provided by a manufacturer of the active-matrix display panel. For example, the baseline may be determined dynamically using any appropriate methodology. In an example, diagnostic processes may be performed in order to determine high-frequency operating characteristics of all, or a set of, picture elements in an active-matrix display panel. The operating characteristics may be aggregated and processed—for example, averaged or averaged using weighting—to determine a baseline for the active-matrix display panel against which the operation of individual picture elements may be compared during testing. In some implementations, the baseline for one active-matrix display panel may be used for testing of multiple other active-matrix display panels, e.g., of the same type, from the same manufacture, etc.

Figure 2:
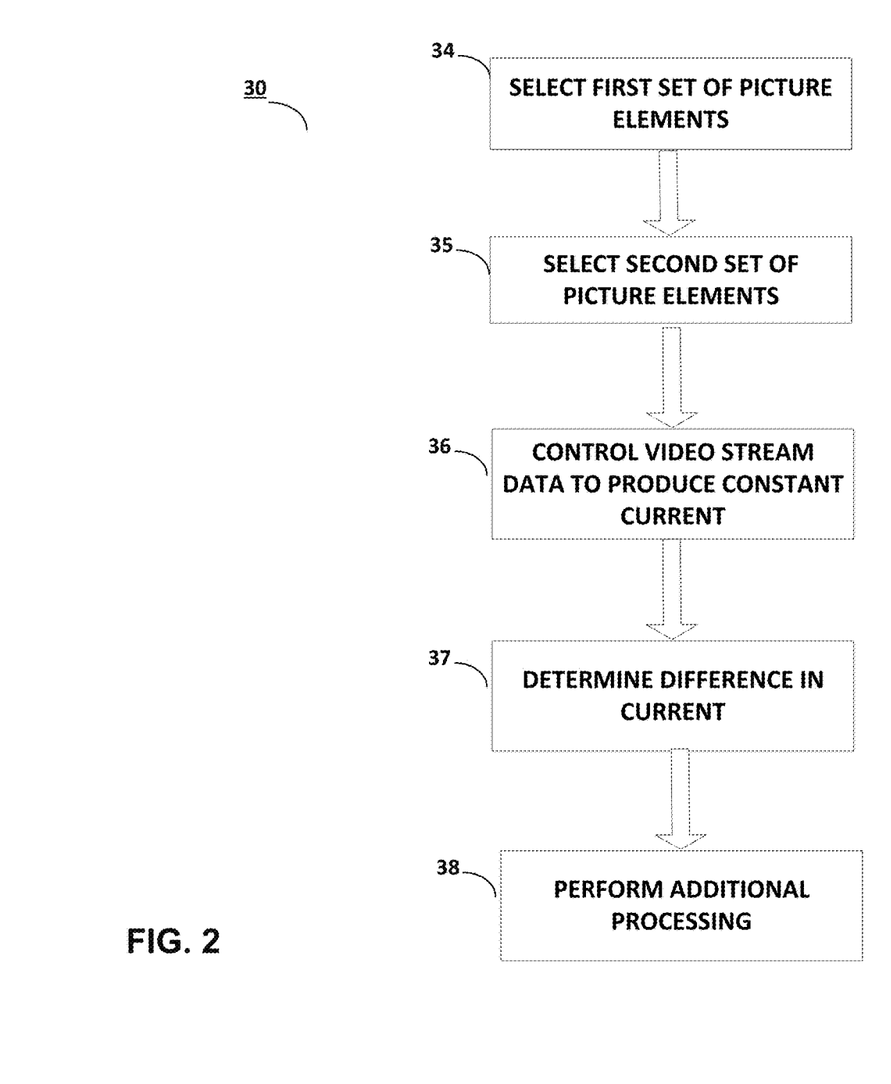
FIG. 2 is a flowchart showing an example process for detecting potentially-defective picture elements on an active-matrix display panel.

Thus, by observing the output of the power supply, it is possible to identify whether there are one or more potentially-defective picture elements in the active-matrix display panel and, as described, to identify where those potentially-defective picture elements are located on the display panel. Potentially-defective picture elements may then be compared to one or more baselines to determine which potentially-defective picture elements are actually defective. Those that are actually defective may be corrected, e.g., through calibration, or binned, as described below. If the defects are too great, the panel may be discarded or one or more parts thereof replaced. FIG. 2 shows an example process 30 for identifying potentially-defective picture elements (e.g., pixels or subpixels) in an active-matrix display panel. Although the operations of FIG. 2 are shown in a particular sequence, the operations may be performed in any appropriate sequence, and is not limited to that shown.

Figure 3:
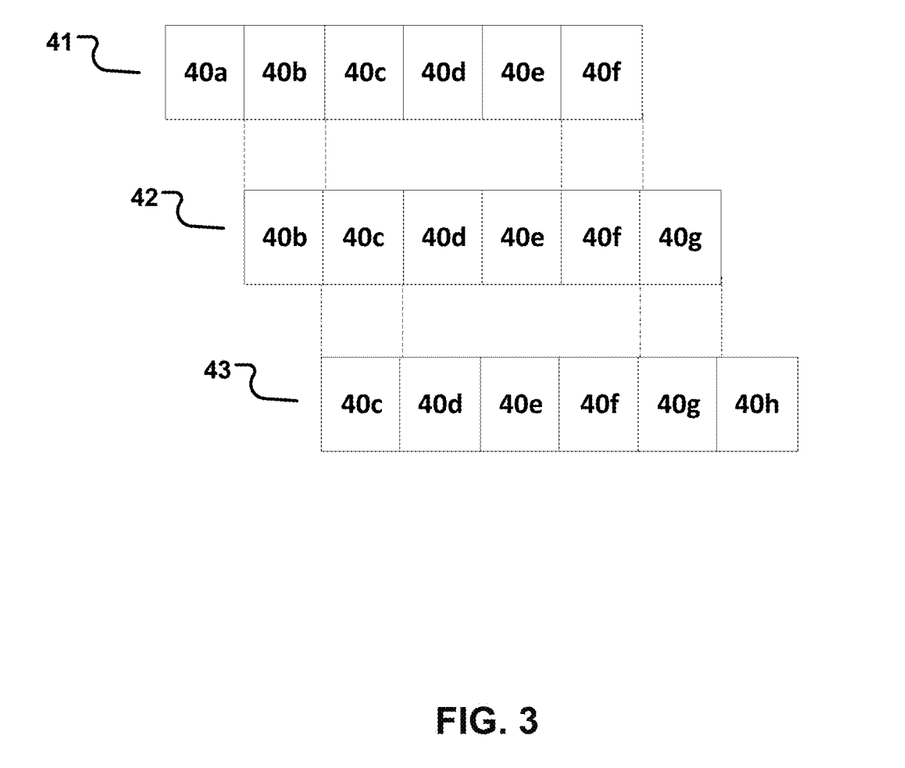
FIG. 3 shows examples of groups of pixels on an active-matrix display panel.

Referring to FIG. 2, example process 30 includes selecting (34) a first set of picture elements that are usable to detect defective picture elements in the active-matrix display panel. The first set of picture elements may be any appropriate number of picture elements, typically more than one, and be at any appropriate location on the active-matrix display panel. In some implementations, picture elements in the first set are part of a same row in the active-matrix display. In some implementations, picture elements in the first set are all in a same row in the active-matrix display. In some implementations, picture elements in the first set are in multiple rows of the active-matrix display. FIG. 3 shows an example of a first set 41 of picture elements. In this example, the picture elements in the first set are in a same row and are labeled 40a, 40b, 40c, 40d, 40e, and 40f. Although six picture elements are shown, any appropriate number of picture elements may be part of the first set.

Example process 30 includes selecting (35) a second set of picture elements that are usable to detect defective picture elements in the active-matrix display panel. The second set of picture elements may be any appropriate number of picture elements, typically more than one. In some implementations, picture elements in the second set are part of a same row in the active-matrix display. In some implementations, picture elements in the second set are all in a same row in the active-matrix display. In some implementations, picture elements in the second set are in multiple rows of the active-matrix display. FIG. 3 shows an example of a second set 42 of picture elements. In this example, picture elements in the second set are in the same row and are labeled 40b, 40c, 40d, 40e, 40f, and 40g. Although six picture elements are shown, any appropriate number of picture elements may be part of the second set.

For reasons evident below, FIG. 3 also shows an example of a third set 43 of picture elements. In this example, the picture elements in the third set are in the same row and are labeled 40c, 40d, 40e, 40f, 40g, and 40h. Although six picture elements are shown, any appropriate number of picture elements may be part of the third set. As shown, the first set, the second set, and the third set have picture elements in common. The dashed lines relate the relative placement of the different sets in the same row.

In the example of FIG. 3, the first and second set of picture elements have the same number of picture elements; at least some of the picture elements 41 are common to both the first set and the second set, and at least one picture element—in this example two picture elements 40a and 40g—is not common to both the first set and the second set. The video stream data is controlled (36) so that the same amount, or substantially the same amount, of current is intended to pass to both the first and second sets of picture elements during different refreshes. That is, the current is set to be a constant or substantially constant, e.g., having variations that are within a predefined tolerance, such as 1%, 2%, 3%, 4%, 5%, and so forth of total. If all picture elements in both sets are operating correctly, the total current should be the same through each set. Thus, in some implementations, if all picture elements in both the first and second sets of picture elements are operating correctly (e.g., not defective), the difference between the total current through each set should be zero, or substantially zero. In some implementations, if one or more of the picture elements in either or both sets are not operating correctly (e.g., defective), the difference/mismatch between the total current through each set will be nonzero. In some implementations, picture elements may be deemed to operating correctly if the total current is nonzero and if their operation falls within a predefined tolerance, as described below.

According to process 30, the difference in current through the first set of picture elements and the second set of picture elements is determined (37) during different refresh cycles. For example the total current through the second set of picture elements is subtracted from the total current through the first set of picture elements, or the total current through the first set of picture elements is subtracted from the total current through the second set of picture elements. The resulting difference removes the quasi-static component (e.g., the DC component) of the current, leaving a remainder, which corresponds to the AC component of the current output from the power supply.

In some implementations, the presence of the AC component in the difference means that there may be at least one defective picture element. Accordingly, additional processing (38) may be performed. For example, the potentially-defective picture elements may be processed to identify actually-defective picture elements. For example, as explained above, the identity of the defect, the type of defect, and the magnitude of the defect or defects may be identified by comparison to a baseline or more than one baseline, and the location of each defective picture element may be identified. In some implementations, the AC component is compared to a predetermined or dynamically-determined baseline or baselines to identify the defect, the type of the defect, and the magnitude of the defect. For example, the AC-difference/mismatch values may be obtained for the first and second sets of picture elements for at least two or more different luminosities of the picture elements. The points resulting may be plotted on a graph. The resulting graph may be compared to a graph representing a predetermined baseline or a dynamically-determined baseline. A deviation of the intercept from the predetermined or dynamically-determined baseline may represent transistor threshold voltage variations introduced by the picture element hardware, e.g., driver 12. A deviation of the slope from the predetermined or dynamically-determined baseline may represent transistor mobility variations introduced by the picture element hardware, e.g., driver 12. Deviations that exceed acceptable tolerances are indicative of a defective picture element. In some implementations, other processes may be used to detect defective picture elements.

In some implementations, it is possible to identify a particular picture element having a defect. For example, referring to FIG. 3, assuming that the current remains constant for all sets of picture elements, the first set 41 of picture elements is compared to the second set 42 of picture elements, and the second set 42 of picture elements is compared to a third set 43 of picture elements having the same number of picture elements as each of the first and second sets. If the difference (e.g., the mismatch) between the first set 41 of picture elements and the second set 42 of picture elements is zero, including for the AC component, this may indicate that there are no defective picture elements in either set. If then the difference (e.g., the mismatch) between the third set 43 of picture elements and the second set 42 of picture elements is nonzero in the AC component, then it is known that there is at least one defective picture element on the panel. In this example, because picture element 40*h* in the third set was in the second comparison but not in the first comparison, it may be inferred that picture element 40*h* is the defective picture element. Any appropriate number of comparisons may be employed to identify the locations—e.g., the addresses—of defective picture elements on an active-matrix display panel. In the example presented in the images, comparisons are performed in the same row; however, the process is not limited to this.

As noted, after all or part of the active-matrix display panel has been tested for defective picture elements, additional processing (38) may be performed. For example, calibration may be performed. For example, a defective picture elements may be calibrated based at least on the output of the hybrid power supply to correct, at least partly, mismatches among at least some of the picture elements.

In some implementations, calibration may include correcting for at least one of transistor threshold voltage variations, transistor mobility variations, or a combination of transistor threshold voltage variations and transistor mobility variations. For example, as explained above, the type of defect and its magnitude may be identified by comparison to a baseline, and the location of each defective picture element may be identified. In some implementations, calibration may include generating calibration values for at least some of the defective and/or non-defective picture elements, and storing the calibration values in computer memory for use by the active-matrix display panel. The computer memory containing the calibration coefficients may be located on the active-matrix display panel, or the computer memory containing the calibration coefficients may be configured for connection to the active-matrix display panel. For example, the active-matrix display panel may include an input interface configured to connect to a device containing the computer memory in order to receive the calibration values. The interface may be industry-standard or customizable and non-standard, as explained herein. The calibration values may be loaded at operation of the active-matrix display panel to correct, or to improve, the overall image. In some cases, the calibration coefficients may correct defective picture elements. In some implementations, an active-matrix display panel may not be salvageable due to the number of defects, and may be discarded as a result of process 30. In some implementations, an active-matrix display panel may be binned based on its quality, with lower-grade panels being sold at a lower cost than higher-grade panels.

Figure 4:
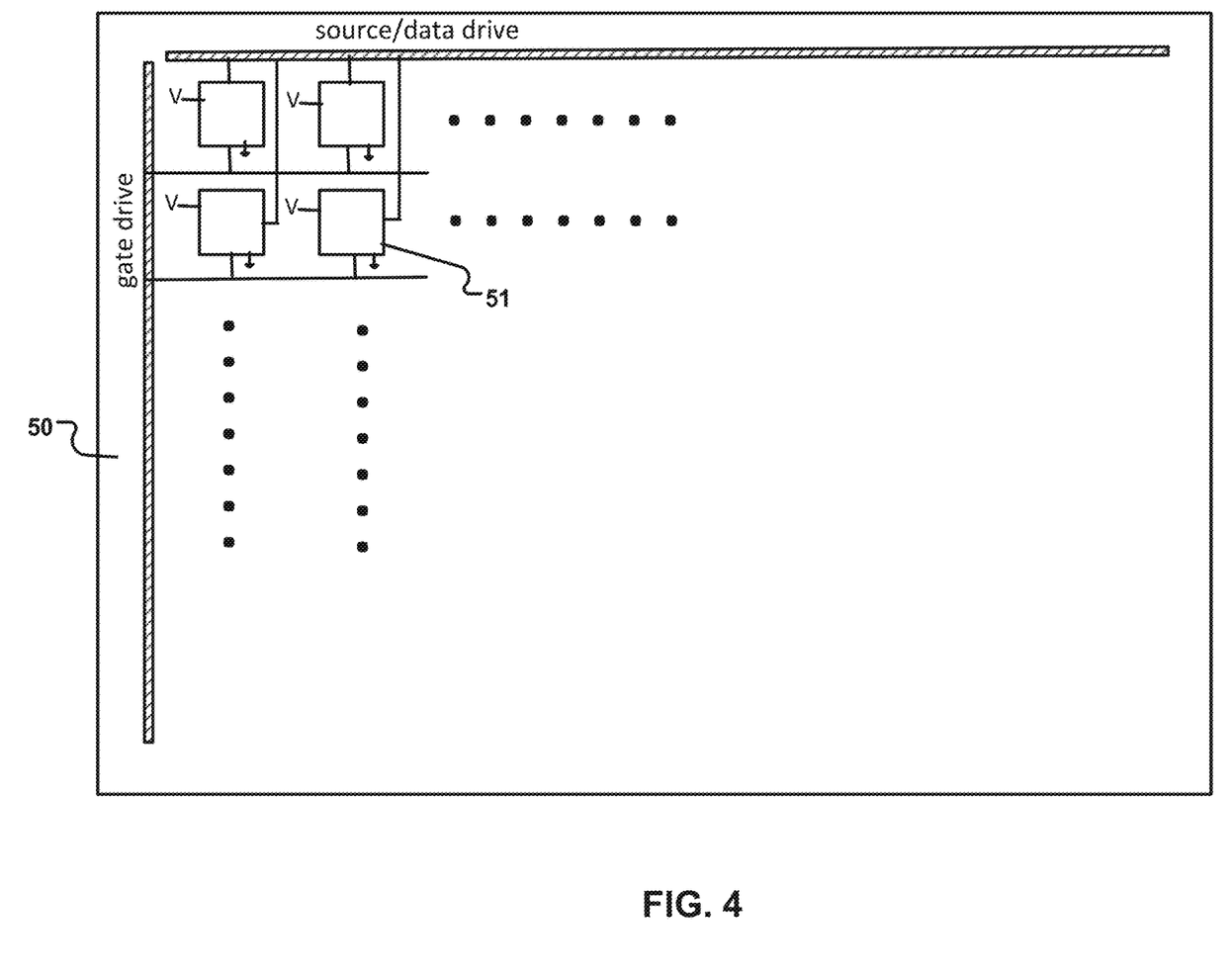
FIG. 4 is an example of an active-matrix display panel.

FIG. 4 is an example of an active-matrix display panel 50 that may be tested or otherwise subjected to the example processing described herein. Each example picture element 51 may be of the type shown in FIG. 1. In this example, the picture elements are connected to common gate drive and source drive lines. The picture elements are also connected to a common voltage (V) and common ground. The ellipses in FIG. 4 indicate that the rows and columns of the picture elements continue.

The example processes described herein may be used to calibrate any appropriate active-matrix display panel including, but not limited to, AMOLED panels having different sizes, form factors, or uses. For example, the processes may be used to calibrate active-matrix display panels for mobile telephones, smartphones, tablet computing devices, computer monitors, automobile display screens, and the like. In this regard, in recent years, automobile display screens have become more functional, and are configured to display more information than in years past. For example, automobile display screens may be configured to display information relating to the operation of the vehicle, such as backing-up, blind spots, or the like. Automobile display screens may be configured to display media information, including video, such as movies of television programs, or video representing operational aspects of the automobile, such as the status of fluids, tire pressure, engine problems, and the like. The processes described herein for calibrating active-matrix display panels may be used to calibrate active-matrix display screens used in automobiles for these and other purposes. The calibration may be performed at an automobile dealer or repair shop, for example.

In some implementations, an active-matrix display panel, such as an AMOLED display screen, may be curved, foldable, or both curved and foldable. The example processes described herein may be used to calibrate active-matrix display panels that are flat, curved, foldable, flexible, both curved and foldable or flexible, or both flat and foldable or flexible. Generally, the example processes may be used to calibrate any appropriate type of active-matrix display panel. The example processes may also be used to calibrate active-matrix display panels having any appropriate shape or form factor including, but not limited to, rectangular, square, circular, oval, irregularly shaped, or some combination of these or other shapes.

The example processes may also be used to calibrate active-matrix display panels periodically and at any appropriate location. For example, AMOLED mobile display screens on mobile devices may be calibrated yearly. Likewise, AMOLED display screens on televisions may require periodic calibration. The example processes may be used to calibrate mobile display screens, television screens, or the like periodically, intermittently, or sporadically, as desired or required.

In some implementations, the example processes may be incorporated into a device or a tool to which a display, such as smartphone display, may be connected for calibration. For example, the tool may include one or more ports or connectors to interface to a smartphone or its display—or to any other appropriate type of active-matrix display panel that is being, or is to be, calibrated. The tool may include one or more processing devices, such as those described herein, to perform calibration of an active-matrix display panel at any appropriate location, such as in a factory, in a commercial setting (e.g., in a retail store or kiosk), or in-home.

In some implementations, the tool may be portable, and contain any of the features described herein, as appropriate. For example, the tool may be a self-contained, portable device that can be moved from place-to-place to test, and to calibrate, active-matrix display panels. For example, the tool may include one or more processing devices, memory, and appropriate computer programs to perform process 30 to identify picture elements are potentially defective, and then to identify which ones are actually defective. When appropriate, the defective pixel elements may be calibrated based at least on the output of the power supply to correct, at least partly, mismatches among at least some of the picture elements, as described herein. The tool may include one or more standard interfaces, such as a lightning connector, a USB-C (universal serial bus—C) connector, a USB connector, or other appropriate connector that mates to portable computing devices such as smartphones or tables. The one or more standard interfaces may also interface to an automobile electrical system to access components of the automobile's display active-matrix display screen.

The example process described herein may be implemented by, and/or controlled using, one or more computer systems comprising hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The example process described herein can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes or does not include intervening components but that nevertheless allows electrical signals to flow between connected components. Any "connection" involving electrical circuitry that allows signals to flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A method comprising:
    powering, via a power supply, an active-matrix display panel comprised of picture elements; and
    identifying, based on an output of the power supply, one or more picture elements in the active-matrix display panel that are potentially defective;
    wherein identifying the one or more picture elements that are potentially defective comprises:
        removing a quasi-static component of the output of the power supply by obtaining a difference between an output of the power supply used by a first set of the picture elements and an output of the power supply used by a second set of the picture elements, the difference comprising a remainder output for the one or more picture elements; and
        determining that the one or more picture elements are potentially defective based on the remainder output.

2. The method of claim 1, wherein the remainder output has a frequency that is higher than a frequency of the quasi-static component.

3. The method of claim 1, further comprising:
    identifying, among one or more of the picture elements that are potentially defective, one or more picture elements that are defective by comparing at least the remainder output to a predefined baseline for the active-matrix display panel.

4. The method of claim 1, further comprising:
    identifying, among one or more of the picture elements that are potentially defective, one or more picture elements that are defective by performing operations comprising:
        processing outputs of a number of picture elements on the display panel to produce a baseline; and
        comparing at least the remainder output to the baseline.

5. The method of claim 4, wherein processing comprises generating an average of the outputs of all picture elements on the display panel to produce the baseline.

6. The method of claim 1, further comprising:
calibrating the picture elements based at least on the output of the power supply to correct, at least partly, mismatches among at least some of the picture elements.

7. The method of claim 6, wherein the mismatches result from at least one of transistor threshold voltage variations or transistor mobility variations introduced by picture element hardware; and
wherein calibrating the picture elements comprises correcting for at least one of the transistor threshold voltage variations, transistor mobility variations, or a combination of the transistor threshold voltage variations and the transistor mobility variations.

8. The method of claim 7, wherein the picture element hardware comprises a transconductance amplifier configured to receive voltage and to output current to an organic light emitting diode (OLED).

9. The method of claim 6, wherein calibrating comprises:
generating calibration values for at least some of the picture elements based on the output of the power supply, the output comprising multiple values; and
storing the calibration values in computer memory for use by the active-matrix display panel.

10. The method of claim 9, wherein the active-matrix display panel comprises an input interface configured to connect to a device comprising the computer memory in order to receive the calibration values.

11. The method of claim 10, wherein the input interface comprises an industry standard, non-customized interface.

12. The method of claim 10, wherein the input interface comprises a customizable interface.

13. The method of claim 1, wherein the active-matrix display panel comprises an active-matrix organic light-emitting diode (AMOLED) display panel; and
wherein the picture elements comprise subpixels of the AMOLED display panel.

14. The method of claim 1, wherein the active-matrix display panel comprises a curved active-matrix display panel.

15. The method of claim 1, wherein the active-matrix display panel comprises a foldable active-matrix display panel.

16. The method of claim 1, wherein the active-matrix display panel is part of a mobile computing device.

17. The method of claim 1, wherein the active-matrix display panel is part of an automobile.

18. The method of claim 1, wherein the method is performed periodically as part of a process to calibrate the active-matrix display panel.

19. A method comprising:
powering, via a power supply, an active-matrix display panel comprised of picture elements; and
identifying, based on an output of the power supply, one or more picture elements in the active-matrix display panel that are potentially defective;
wherein identifying the one or more picture elements that are potentially defective comprises:
removing a quasi-static component of the output of the power supply leaving a remainder output; and
determining that the one or more picture elements are potentially defective based on the remainder output;
wherein the output of the power supply has a dynamic range that exceeds a predetermined range; and
wherein the quasi-static component is removed so that the remainder output has a dynamic range that is less than the predetermined range.

20. A method comprising:
powering, via a power supply, an active-matrix display panel comprised of picture elements; and
identifying, based on an output of the power supply, one or more picture elements in the active-matrix display panel that are potentially defective;
wherein identifying the one or more picture elements comprises:
controlling a data stream to the active-matrix display panel so that a sum of digital codes in the data stream remains substantially constant for multiple refreshes of the active-matrix display panel;
detecting the output of the power supply to a first set of the picture elements during a first refresh of the multiple refreshes to produce a first output;
detecting the output of the power supply to a second set of the picture elements during a second refresh of the multiple refreshes to produce a second output; and
detecting a mismatch between at least two picture elements based on a difference between the first output and the second output.

21. The method of claim 20, wherein the at least two picture elements comprise a first picture element in the first set but not in the second set, and a second picture element in the second set but not in the first set.

22. A method comprising:
powering, via a power supply, an active-matrix display panel comprised of picture elements; and
identifying, based on an output of the power supply, one or more picture elements in the active-matrix display panel that are potentially defective;
wherein the power supply comprises a hybrid power supply and the output of the power supply comprises a first output range and a second output range, the hybrid power supply comprising a high-frequency part and a low-frequency part, the low-frequency part for producing the first output range covering a first frequency spectrum, and the high-frequency part for producing the second output range covering a second frequency spectrum, the first frequency spectrum comprising frequencies that are lower than frequencies in the second frequency spectrum.

23. The method of claim 22, wherein the high-frequency part and the low-frequency part comprise separate power supplies.

24. The method of claim 22, wherein the high-frequency part and the low-frequency part are parts of a single power supply, the high-frequency part stripping signals in the first frequency spectrum to produce signals in the second frequency spectrum.

25. The method of claim 22, wherein identifying comprises detecting a mismatch between at least two picture elements when the second output range of the power supply contains a nonzero value.

26. A method comprising:
powering, via a power supply, an active-matrix display panel comprised of picture elements; and
identifying, based on an output of the power supply, one or more picture elements in the active-matrix display panel that are potentially defective;
wherein the power supply comprises a hybrid power supply and the output of the power supply comprises a first output range and a second output range, the hybrid power supply comprising a high-frequency part and a low-frequency part, the low-frequency part for producing the first output range covering a first frequency spectrum, and the high-frequency part for producing the second output range covering a second frequency spectrum, the first frequency spectrum comprising frequencies that are lower than frequencies in the second frequency spectrum; and wherein identifying comprises detecting a mismatch among the picture elements.

27. The method of claim 26, wherein detecting the mismatch comprises:
controlling a data stream to the active-matrix display panel so that a sum of digital codes in the data stream remains substantially constant for multiple refreshes of the active-matrix display panel;
detecting a first output of the power supply to a first set of the picture elements during a first refresh of the multiple refreshes; and
detecting a second output of the power supply to a second set of the picture elements during a second refresh of the multiple refreshes to produce a second output;
wherein the mismatch comprises a difference between the first output and the second output, the difference being in the second output range.

28. A system comprising:
a power supply to power an active-matrix display panel comprised of picture elements; and
one or more processing devices to perform operations comprising: identifying, based on an output of the power supply, one or more picture elements in the active-matrix display panel that are potentially defective;
wherein operations for identifying the one or more picture elements that are potentially defective comprise:
removing a quasi-static component of the output of the power supply by obtaining a difference between an output of the power supply used by a first set of the picture elements and an output of the power supply used by a second set of the picture elements, the difference comprising a remainder output for the one or more picture elements; and
determining that the one or more picture elements are potentially defective based on the remainder output.

29. The system of claim 28, wherein the remainder output has a frequency that is higher than a frequency of the quasi-static component.

30. The system of claim 28, wherein the operations comprise:
identifying, among one or more of the picture elements that are potentially defective, one or more picture elements that are defective by comparing at least the remainder output to a predefined baseline for the active-matrix display panel.

31. The system of claim 28, wherein the operations comprise:
identifying, among one or more of the picture elements that are potentially defective, one or more picture elements that are defective by performing operations comprising:
processing outputs of a number of picture elements on the display panel to produce a baseline; and
comparing at least the remainder output to the baseline.

32. The system of claim 31, wherein processing comprises generating an average of the outputs of all picture elements on the display panel to produce the baseline.

33. The system of claim 28, wherein the operations comprise:
calibrating the picture elements based at least on the output of the power supply to correct, at least partly, mismatches among at least some of the picture elements.

34. The system of claim 33, wherein the mismatches result from at least one of transistor threshold voltage variations or transistor mobility variations introduced by picture element hardware; and
wherein calibrating the picture elements comprises correcting for at least one of the transistor threshold voltage variations, transistor mobility variations, or a combination of the transistor threshold voltage variations and the transistor mobility variations.

35. The system of claim 34, wherein the picture element hardware comprises a transconductance amplifier configured to receive voltage and to output current to an organic light emitting diode (OLED).

36. The system of claim 33, wherein calibrating comprises:
generating calibration values for at least some of the picture elements based on the output of the power supply, the output comprising multiple values; and
storing the calibration values in computer memory for use by the active-matrix display panel.

37. The system of claim 36, wherein the active-matrix display panel comprises an input interface configured to connect to a device comprising the computer memory in order to receive the calibration values.

38. The system of claim 37, wherein the input interface comprises an industry standard, non-customized interface.

39. The system of claim 37, wherein the input interface comprises a customizable interface.

40. The system of claim 28, wherein the active-matrix display panel comprises an active-matrix organic light-emitting diode (AMOLED) display panel; and
wherein the picture elements comprise subpixels of the AMOLED display panel.

41. The system of claim 28, wherein the active-matrix display panel comprises a curved active-matrix display panel.

42. The system of claim 28, wherein the active-matrix display panel comprises a foldable active-matrix display panel.

43. The system of claim 28, wherein the active-matrix display panel is part of a mobile computing device.

44. The system of claim 28, wherein the active-matrix display panel is part of an automobile.

45. The system of claim 28, wherein the operations are executed repeatedly as part of a process to calibrate the active-matrix display panel.

46. A system comprising:
a power supply to power an active-matrix display panel comprised of picture elements; and
one or more processing devices to perform operations comprising: identifying, based on an output of the power supply, one or more picture elements in the active-matrix display panel that are potentially defective;
wherein identifying the one or more picture elements that are potentially defective comprises:
removing a quasi-static component of the output of the power supply leaving a remainder output; and
determining that the one or more picture elements are potentially defective based on the remainder output;
wherein the output of the power supply has a dynamic range that exceeds a predetermined range; and wherein the quasi-static component is removed so that the remainder output has a dynamic range that is less than the predetermined range.

47. A system comprising:
a power supply to power an active-matrix display panel comprised of picture elements; and
one or more processing devices to perform operations comprising: identifying, based on an output of the power supply, one or more picture elements in the active-matrix display panel that are potentially defective;
wherein identifying the one or more picture elements comprises:
controlling a data stream to the active-matrix display panel so that a sum of digital codes in the data stream remains substantially constant for multiple refreshes of the active-matrix display panel;
detecting the output of the power supply to a first set of the picture elements during a first refresh of the multiple refreshes to produce a first output;
detecting the output of the power supply to a second set of the picture elements during a second refresh of the multiple refreshes to produce a second output; and
detecting a mismatch between at least two picture elements based on a difference between the first output and the second output.

48. The system of claim 47, wherein the at least two picture elements comprise a first picture element in the first set but not in the second set, and a second picture element in the second set but not in the first set.

49. A system comprising:
a power supply to power an active-matrix display panel comprised of picture elements; and
one or more processing devices to perform operations comprising: identifying, based on an output of the power supply, one or more picture elements in the active-matrix display panel that are potentially defective;
wherein the power supply comprises a hybrid power supply and the output of the power supply comprises a first output range and a second output range, the hybrid power supply comprising a high-frequency part and a low-frequency part, the low-frequency part for producing the first output range covering a first frequency spectrum, and the high-frequency part for producing the second output range covering a second frequency spectrum, the first frequency spectrum comprising frequencies that are lower than frequencies in the second frequency spectrum.

50. The system of claim 49, wherein the high-frequency part and the low-frequency part comprise separate power supplies.

51. The system of claim 49, wherein the high-frequency part and the low-frequency part are parts of a single power supply, the high-frequency part stripping signals in the first frequency spectrum to produce signals in the second frequency spectrum.

52. The system of claim 49, wherein identifying comprises detecting a mismatch between at least two picture elements when the second output range of the power supply contains a nonzero value.

53. A system comprising:
a power supply to power an active-matrix display panel comprised of picture elements; and
one or more processing devices to perform operations comprising: identifying, based on an output of the power supply, one or more picture elements in the active-matrix display panel that are potentially defective;
wherein the power supply comprises a hybrid power supply and the output of the power supply comprises a first output range and a second output range, the hybrid power supply comprising a high-frequency part and a low-frequency part, the low-frequency part for producing the first output range covering a first frequency spectrum, and the high-frequency part for producing the second output range covering a second frequency spectrum, the first frequency spectrum comprising frequencies that are lower than frequencies in the second frequency spectrum; and
wherein identifying comprises detecting a mismatch among the picture elements.

54. The system of claim 53, wherein detecting the mismatch comprises:
controlling a data stream to the active-matrix display panel so that a sum of digital codes in the data stream remains substantially constant for multiple refreshes of the active-matrix display panel;
detecting a first output of the power supply to a first set of the picture elements during a first refresh of the multiple refreshes; and
detecting a second output of the power supply to a second set of the picture elements during a second refresh of the multiple refreshes to produce a second output;
wherein the mismatch comprises a difference between the first output and the second output, the difference being in the second output range.

55. A tool that is portable, the tool comprising:
memory storing instructions that are executable; and
one or more processing devices to execute the instructions to perform operations comprising:
identifying, based on an output of a power supply, one or more picture elements in an active-matrix display panel that are potentially defective; and
calibrating the active-matrix display panel by adjusting the one or more picture elements based on coefficients;
wherein operations for identifying the one or more picture elements that are potentially defective comprise:
removing a quasi-static component of the output of the power supply by obtaining a difference between an output of the power supply used by a first set of the picture elements and an output of the power supply used by a second set of the picture elements, the difference comprising a remainder output for the one or more picture elements; and
determining that the one or more picture elements are potentially defective based on the remainder output.

56. The tool of claim 55, wherein the tool is self-contained.

57. The tool of claim 55, further comprising one or more interfaces to connect to a mobile computing device comprising the active-matrix display panel.

58. The tool of claim 55, further comprising one or more interfaces to connect to an automobile comprising the active-matrix display panel.

* * * * *